United States Patent [19]

Asazawa

[11] Patent Number: 5,266,846
[45] Date of Patent: Nov. 30, 1993

[54] DIFFERENTIAL CIRCUIT IMPLEMENTED BY BIPOLAR TRANSISTORS FREE FROM EXCESS BASE-EMITTER REVERSE BIAS VOLTAGE

[75] Inventor: Hiroshi Asazawa, Tokyo, Japan
[73] Assignee: NEC Corporation, Tokyo, Japan
[21] Appl. No.: 842,050
[22] Filed: Feb. 26, 1992
[30] Foreign Application Priority Data
  Mar. 7, 1991 [JP] Japan .................................. 3-041476
[51] Int. Cl.$^5$ .................. H03K 19/086; H03K 19/092
[52] U.S. Cl. .................................... 307/455; 307/443; 307/475
[58] Field of Search ........................ 307/455, 475, 443
[56] References Cited

U.S. PATENT DOCUMENTS

| | | | |
|---|---|---|---|
| 3,535,546 | 10/1970 | Davis | 307/455 |
| 3,569,746 | 3/1971 | Lacour et al. | 307/455 |
| 3,612,911 | 10/1971 | Kroos | 307/455 |
| 4,565,976 | 1/1986 | Campbell | 307/455 |
| 5,113,095 | 5/1992 | Haehne | 307/455 |

*Primary Examiner*—Edward P. Westin
*Assistant Examiner*—Richard Roseen
*Attorney, Agent, or Firm*—Whitham & Marhoefer

[57] ABSTRACT

A differential circuit comprises a differential stage responsive to input voltage levels in an ECL range for producing an output signal at an output node, a setting stage associated with the differential stage and responsive to a set signal in a CMOS range for setting the output node to a predetermined level, wherein a level-shift element is coupled between a bipolar transistor responsive to the set signal and the common emitter node of bipolar transistors responsive to the input voltage levels so that each bipolar transistor is prevented from destruction due to excess reverse bias voltage applied to the base node and the emitter node.

6 Claims, 10 Drawing Sheets

DIFFERENTIAL CIRCUIT IMPLEMENTED BY BIPOLAR TRANSISTORS FREE FROM EXCESS BASE-EMITTER REVERSE BIAS VOLTAGE

FIELD OF THE INVENTION

This invention relates to a differential circuit and, more particularly, to a bipolar implementation.

DESCRIPTION OF THE RELATED ART

A standard differential circuit implemented by bipolar transistors is illustrated in FIG. 1, and comprises an n-p-n type bipolar transistor Q1 coupled between a power voltage source Vcc and a constant current source 1, and a series combination of a resistor R1 and an n-p-n type bipolar transistor Q2 coupled between the power voltage source Vcc and the constant current source 1. An input node IN1 is coupled with the base node of the n-p-n type bipolar transistor Q1, and a reference voltage level Vr is supplied to the base node of the n-p-n type bipolar transistor Q2. An input voltage signal for a CMOS circuit is supplied to the input node IN1, and is wider in amplitude than a signal for an ECL circuit. A voltage signal for a CMOS circuit swings its voltage level in a CMOS range, and a voltage signal for an ECL circuit swings its voltage level in an ECL range. The collector node of the n-p-n type bipolar transistor Q2 serves as an output node OUT1 of the differential circuit.

The differential circuit thus arranged behaves as follows. If the input voltage signal at the input node IN1 is higher than the reference voltage level Vr, the n-p-n type bipolar transistor Q1 allows much current to flow therethrough, and the n-p-n type bipolar transistor Q2 decreases the amount of current passing therethrough. Then, voltage drop at the resistor R1 is decreased, and the output node OUT1 goes up. However, if the input voltage signal becomes lower than the reference voltage level Vr, the voltage level at the output node OUT1 is decayed.

Turning to FIG. 2 of the drawings, the standard differential circuit shown in FIG. 1 is modified so that a differential voltage signal is applicable to a pair of input nodes IN2 and IN3. Input voltage levels at the input nodes IN2 and IN3 form the differential voltage signal, and are swung in the ECL range. The input voltage levels are respectively supplied from the pair of input nodes IN2 and IN3 to the base nodes of the n-p-n type bipolar transistors Q1 and Q2, and an output node OUT2 is provided between a resistor R2 and the n-p-n type bipolar transistor Q4. The differential circuit shown in FIG. 2 further has an n-p-n bipolar transistor Q5 coupled between the power voltage source Vcc and a constant current source 2, and a set node SET1 is coupled with the base node of the n-p-n type bipolar transistor Q5. A set signal is supplied to the set node SET1, and is swung in the CMOS range. While the set signal remains in the low voltage level, the n-p-n type bipolar transistor Q5 is turned off, and the differential circuit is responsive to the differential voltage signal. However, if the set signal goes up to the high voltage level, the n-p-n type bipolar transistor Q5 turns on, and a large amount of current flows through the n-p-n type bipolar transistor Q5. This results in drastic decrease in the amount of current passing through the resistor R2 regardless of the differential voltage signal, and the output node OUT2 is forcibly elevated to a set level or the high voltage level.

However, a problem is encountered in the prior art differential circuits shown in FIGS. 1 and 2 in that the n-p-n type bipolar transistors Q1/Q2 and Q3/Q4 tend to be destroyed due to reverse bias voltage level between the emitter node and the base node. In detail, when the input voltage level at the input node IN1 is decayed to zero, the voltage level at a node N1 is elevated with the current passing through the n-p-n type bipolar transistor Q2, and the voltage level at the node N1 causes large reverse bias voltage to be applied between the base node and the emitter node of the n-p-n type bipolar transistor Q1. The large reverse bias voltage is causative of destruction of the n-p-n type bipolar transistor Q1. If the reference voltage level Vr is lowered, the n-p-n type bipolar transistor Q2 suppresses the voltage level at the node N1, and the n-p-n type bipolar transistor Q1 is hardly destroyed in the presence of zero volt at the input node Q1. However, when the input node IN1 goes up to the high voltage level, the n-p-n type bipolar transistor Q1 allows the node N1 to go up, and large reverse bias voltage is applied between the emitter node and the base node of the n-p-n type bipolar transistor Q2. Therefore, the n-p-n type bipolar transistor Q2 is much liable to be destroyed instead of the n-p-n type bipolar transistor Q1.

Since the set signal swings its voltage level in the CMOS range, the differential circuit shown in FIG. 2 encounters the similar problem. Namely, if the set signal goes down to zero volt, large reverse bias voltage is applied between the emitter node and the base node of the n-p-n type bipolar transistor Q5. For rescue of the n-p-n type bipolar transistor Q5, the differential voltage signal or the voltage levels at the input nodes IN2 and IN3 may be lowered. However, large reverse bias voltage is applied to one of the n-p-n type bipolar transistors Q3 and Q4 when the n-p-n type bipolar transistor Q5 turns on.

If the n-p-n type bipolar transistors Q1 to Q5 are scaled up, the destruction hardly takes place. However, scaled-up component transistors are not desirable for an electric circuit, especially, for designing such an electrical circuit in a semiconductor integrated circuit.

In order to overcome the problem inherent in the prior art differential circuits shown in FIGS. 1 and 2, differential circuits shown in FIGS. 3 and 4 are proposed. The differential circuit shown in FIG. 3 is disclosed in Japanese Patent Application laid-open (Kokai) No. 59-205825, and comprises a first series combination of a resistor R3 and two n-p-n type bipolar transistors Q6 and Q7 coupled between a power voltage source Vcc and a constant current source 3, and a second series combination of a resistor R4 and two n-p-n type bipolar transistors Q8 and Q9 coupled in parallel to the first series combination. An input node IN4 is coupled with the base node of the n-p-n type bipolar transistor Q6, and a reference voltage Vr is supplied to the base node of the n-p-n type bipolar transistor Q8. For this reason, the differential circuit shown in FIG. 3 basically behaves as similar to the differential circuit shown in FIG. 1 with an input signal in the CMOS range applied to the input node IN4, and converts the input signal in the CMOS range to an output signal of the ECL range at an output node OUT3. However, the n-p-n type bipolar transistors Q7 and Q9 are of the diode-connected transistor, and cause the emitter nodes of the n-p-n type bipolar transistors Q6 and Q8 to be higher in voltage level than a node N2 by the emitter-base forward bias voltage levels of the diode-connected n-p-n type bipolar transistors Q7 and Q9, respectively. This results in small reverse bias voltage between the emitter node and the base node of the n-p-n type bipolar transistor Q6 or Q8 under application of the input voltage signal of zero volt to the input node IN4 or application of lowered reference voltage level Vr to the base node of the n-p-n type bipolar transistor Q8. In other words, the n-p-n type bipolar transistors Q6 and Q8 are less liable to be destroyed.

The differential circuit shown in FIG. 4 is disclosed in Japanese Patent Application laid-open (Kokai) No. 59-12626, and comprises a first series combination of a resistor R5 and an n-p-n type bipolar transistor Q10 coupled between a power voltage source Vcc and a constant current source Vcc and a second series combination of a resistor R6 and an n-p-n type bipolar transistor Q11 coupled in parallel to the first series combination. An input node IN5 is coupled through a resistor R7 to the base node of the n-p-n type bipolar transistor Q10, and another input node IN6 is directly coupled with the base node of the n-p-n type bipolar transistor Q11. Input voltage levels at the input nodes IN5 and IN6 form a differential voltage signal, and the input voltage level at the input node IN5 is swung in the CMOS range. The differential circuit shown in FIG. 4 also converts the input voltage signal at the input node In5 to an output voltage signal in the ECL range at an output node OUT4.

In order to prevent the n-p-n type bipolar transistor Q10 from destruction, an n-p-n type bipolar transistor Q12 is coupled between the power voltage source and the base node of the n-p-n type bipolar transistor Q10. Since the emitter node of the n-p-n type bipolar transistor Q10 is coupled with the base node of the n-p-n type bipolar transistor Q12, the n-p-n type bipolar transistor Q12 turns on in the presence of the input voltage level of zero volt at the input node IN5. Namely, the voltage level at a node N3 allows a forward bias voltage to take place between the base node and the emitter node of the n-p-n type bipolar transistor Q12, and the n-p-n type bipolar transistor Q12 turns on. The power voltage level is supplied from the source Vcc through the n-p-n type bipolar transistor Q12 to the base node of the n-p-n type bipolar transistor Q10. Then, the reverse bias voltage is eliminated from the n-p-n type bipolar transistor Q10, and the forward bias voltage between the base node and the emitter node of the n-p-n type bipolar transistor Q10 is approximately equal to the forward bias voltage between the base node and the emitter node of the n-p-n type bipolar transistor Q12.

Thus, the differential circuits shown in FIGS. 3 and 4 are free from the problem inherent in the differential circuits shown in FIGS. 1 and 2. However, the differential circuits shown in FIGS. 3 and 4 merely convert the input voltage signals in the CMOS into the output signals in the ECL range, and can not forcibly set the output nodes OUT3 and OUT4 the high voltage level regardless of the input voltage levels. The setting function is desirable for a complex electric circuit. Moreover, the differential circuits shown in FIGS. 3 and 4 can not achieve any logical operation, and, accordingly, the differential circuits shown in FIGS. 3 and 4 require logic gates coupled with the output nodes OUT3 and OUT4 for logical operations. However, the logic circuits increase component transistors, and the electric circuit is liable to be enlarged.

SUMMARY OF THE INVENTION

It is therefore an important object of the present invention provide a differential circuit which can forcibly set the output node thereof a predetermined level without destruction of component bipolar transistors.

To accomplish the object, the present invention proposes to associate a set-transistor with a differential stage through a level-shift means.

In accordance with one aspect of the present invention, there is provided a differential circuit comprising: a) first and second input nodes where first and second input voltage levels swung in an ECL range are applied; b) a differential stage having a first bipolar transistor coupled between a first source of voltage level and a common node, a first series combination of a resistor and a second bipolar transistor coupled between the first source of voltage level and the common node, and a constant current source coupled between the common node and a second source of voltage level different from the first source of voltage level, the first and second input voltage levels being supplied to base nodes of the first and second bipolar transistors, respectively; c) an output node provided between the resistor and the second bipolar transistor; and d) a setting stage having a second series combination of a third bipolar transistor and a level-shift means coupled between the first source of voltage level and the common node, the third bipolar transistor being responsive to a set signal swung in a CMOS range for forcibly setting the output node to a predetermined level.

In accordance with another aspect of the present invention, there is provided a differential circuit comprising: a) first and second input nodes where first and second input voltage levels swung in an ECL range are applied; b) a differential stage having a first bipolar transistor coupled between a first source of voltage level and a common node, a first series combination of a resistor and a second bipolar transistor coupled between the first source of voltage level and the common node, and a constant current source associated with the first bipolar transistor and the first series combination and coupled with a second source of voltage level different from the first source of voltage level, the first and second input voltage levels being supplied to base nodes of the first and second bipolar transistors, respectively; c) an output node provided between the resistor and the second bipolar transistor; and d) a setting stage having a third bipolar transistor coupled between the first source of voltage level and the constant current source and a level-shift means coupled between the common node and the constant current source, the third bipolar transistor being responsive to a set signal swung in a CMOS range for forcibly setting the output node to a predetermined level.

BRIEF DESCRIPTION OF THE DRAWINGS

The feature and advantages of the differential circuit according to the present invention will be more clearly understood from the following description taken in conjunction with the accompanying drawings in which.

DESCRIPTION OF THE PREFERRED EMBODIMENTS

First Embodiment

Figure 1:
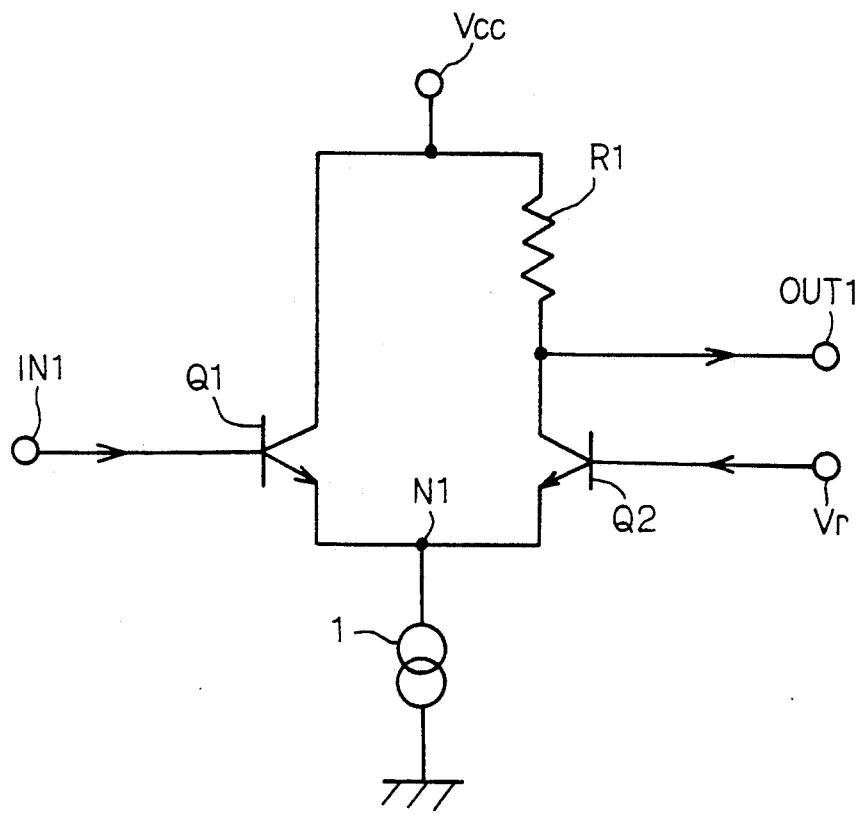
FIG. 1 is a circuit diagram showing the arrangement of the prior art differential circuit.
Figure 2:
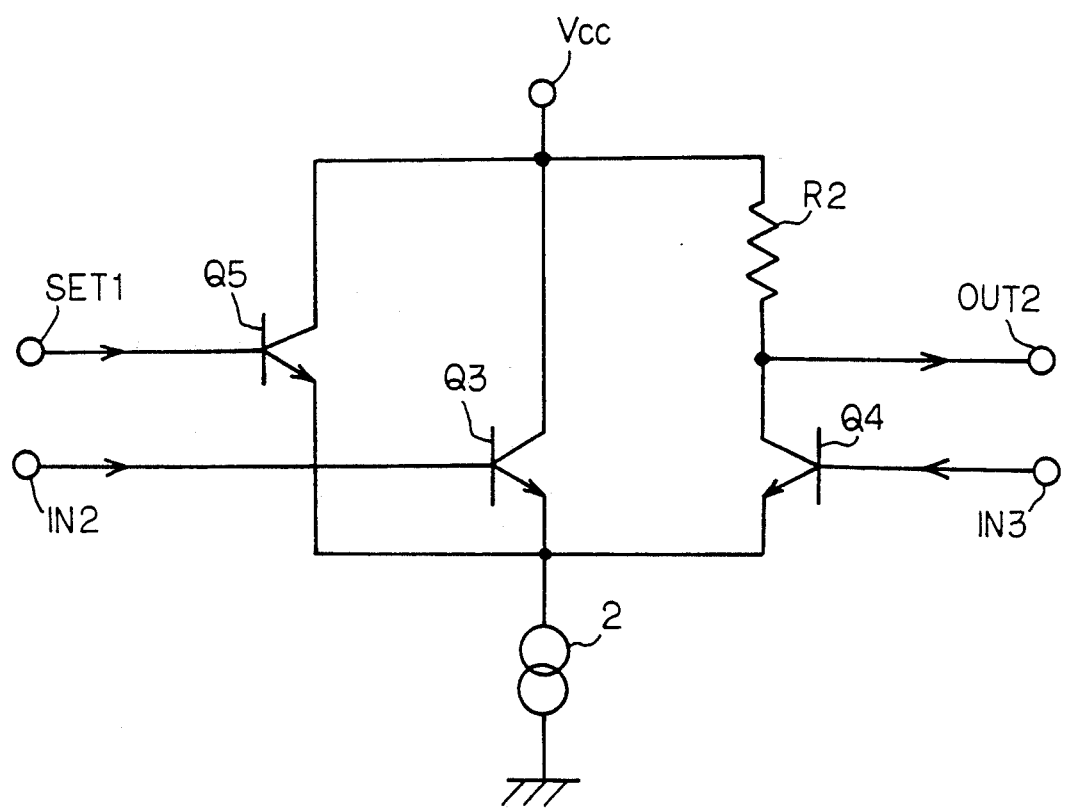
FIG. 2 is a circuit diagram showing the arrangement of another prior art differential circuit.
Figure 3:
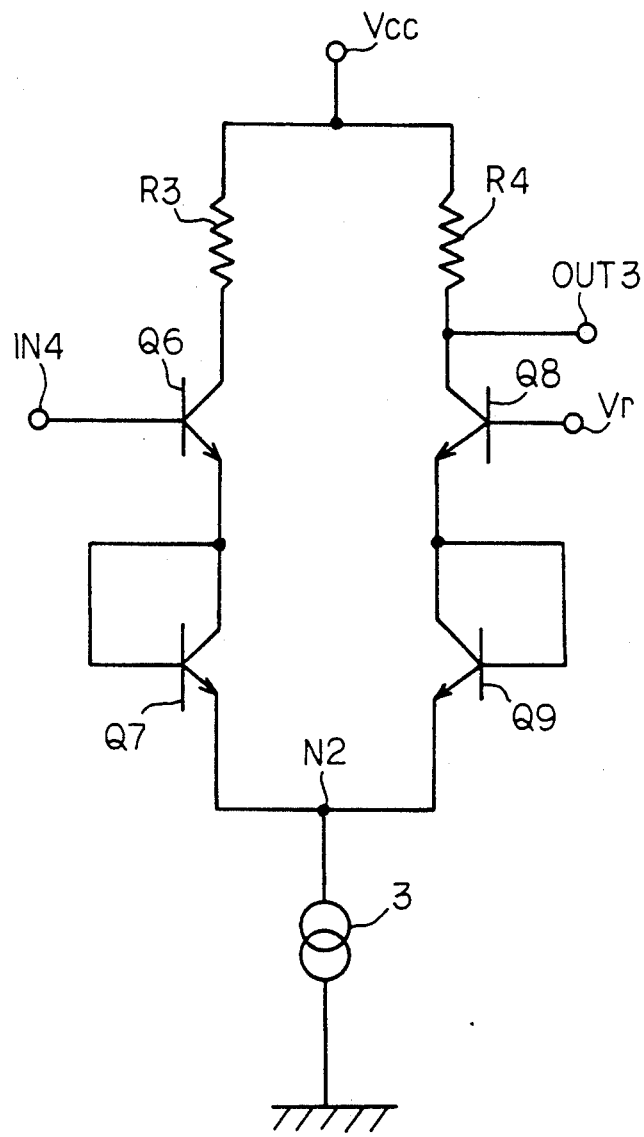
FIG. 3 is a circuit diagram showing the arrangement of yet another prior art differential circuit.
Figure 4:
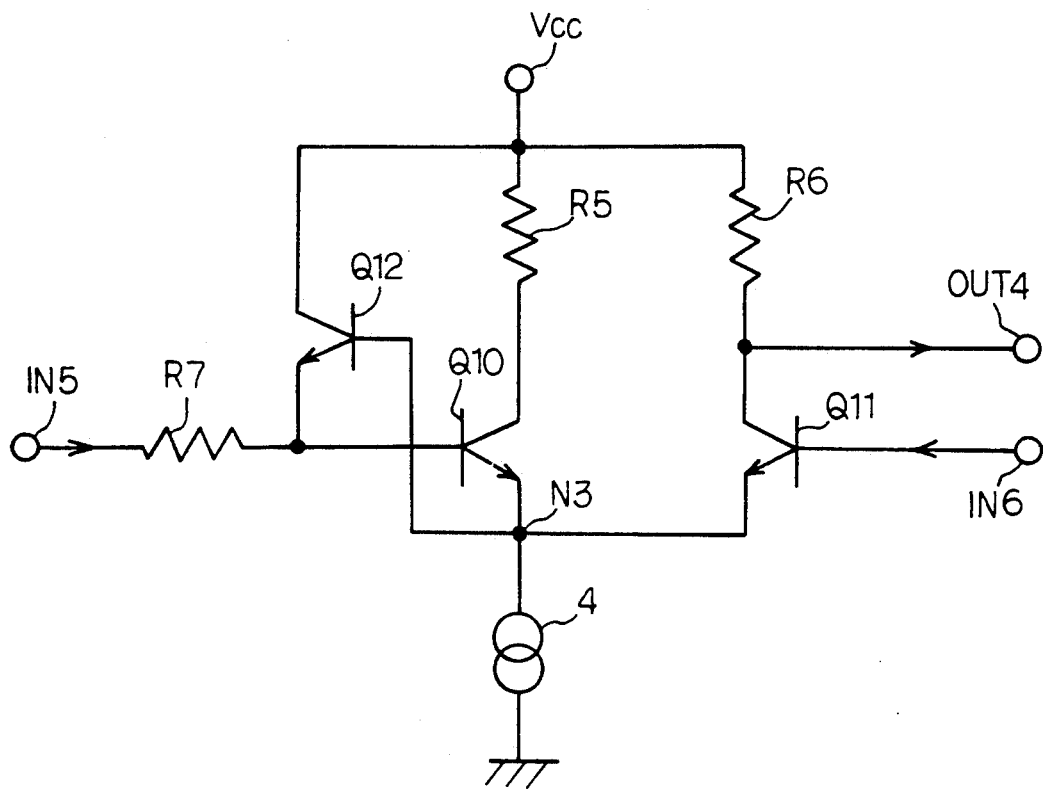
FIG. 4 is a circuit diagram showing the arrangement of still another prior art differential circuit.
Figure 5:
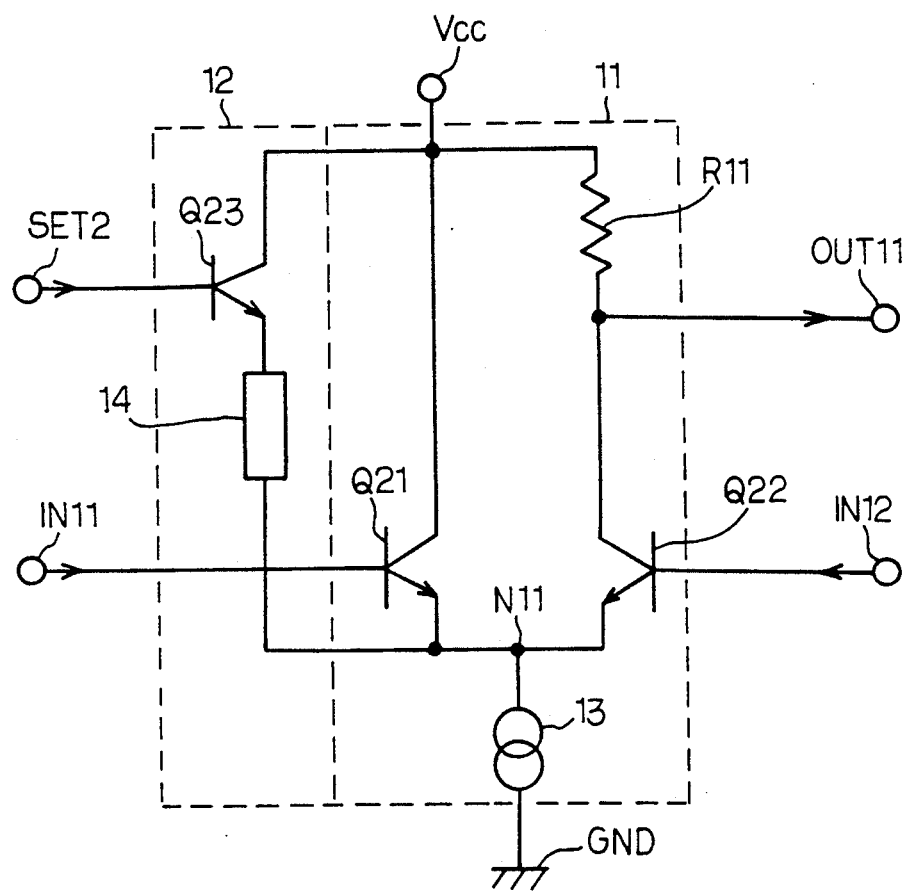
FIG. 5 is a circuit diagram showing the arrangement of a differential circuit according to the present invention.

Referring to FIG. 5 of the drawings, a differential circuit embodying the present invention largely comprises a differential stage 11 and a setting stage 12. The differential stage 11 comprises a first n-p-n type bipolar transistor Q21 coupled between a power voltage source Vcc and a common node N11, a first series combination of a resistor R11 and a second n-p-n type bipolar transistor Q22 and a constant current source 13 coupled between the common node N11 and a ground node GND, and a pair of input nodes N11 and N12 are respectively coupled with the base nodes of the first and second n-p-n type bipolar transistors Q21 and Q22. Input voltage signals swung in the ECL range are supplied from the pair of input nodes N11 and N12 to the first and second n-p-n type bipolar transistors Q21 and Q22. An output node OUT11 is provided between the resistor R11 and the second n-p-n type bipolar transistor Q22.

The setting stage 12 comprises a second series combination of a third n-p-n type bipolar transistor Q23 and a level-shift circuit 14 coupled between the power voltage source Vcc and the common node N11, and a set signal in the CMOS range is supplied from a set node SET2 to the base node of the third n-p-n type bipolar transistor Q23.

The differential circuit thus arranged behaves as follows. While the set signal remains low or zero volt, the third n-p-n type bipolar transistor Q23 is turned off, and the differential stage 11 is responsive to the input voltage signals at the pair of input nodes N11 and N12. If the input voltage signal at the input node N11 is higher than the input voltage signal at the other input node N12, the first n-p-n type bipolar transistor Q21 increases current passing therethrough, and, accordingly, the second n-p-n type bipolar transistor Q22 decreases current passing therethrough. The current thus decreased allows the resistor R11 to reduce the voltage drop, and the output voltage signal at the output node OUT11 is lifted. On the other hand, if the input voltage signal at the input node N11 is lower than the input voltage signal at the other input node N12, the differential stage 11 lowers the output voltage signal at the output node OUT11. Thus, the differential operation is achieved by the differential stage in so far as the set signal remains in zero volt.

Since positive voltage level is applied through the second n-p-n type bipolar transistor Q22 to the common node N11, the positive voltage level at the common node N11 causes reverse bias voltage to take place between the base node and the emitter node of the third n-p-n type bipolar transistor Q23. However, the level-shift circuit 14 reduces the reverse bias voltage, and only relatively small reverse bias voltage is applied between the base node and the emitter node of the third n-p-n type bipolar transistor Q23. In other words, the third n-p-n type bipolar transistor Q23 is hardly destroyed.

If the set signal SET2 goes up to the high voltage level, the third n-p-n type bipolar transistor Q23 turns on, and only a negligible amount of current flows through the series combination of the resistor R11 and the second n-p-n type bipolar transistor Q22. The output node OUT11 is forcibly lifted up regardless of the input voltage signal at the input node N11. Thus, the differential circuit embodying the present can set the output node OUT11 to the high voltage level, and the setting function is desirable for a complex electric circuit.

As described hereinbefore, the reverse bias voltage is relatively small, and it is unnecessary to lower the input voltage signals at the pair of input nodes N11 and N12. Therefore, positive voltage level supplied from the third n-p-n type bipolar transistor Q23 merely produces small reverse bias voltage between the base node and the emitter node of the n-p-n type bipolar transistor Q21 or Q22 supplied with lower input voltage signal, and the n-p-n bipolar transistors Q21 and Q22 are hardly destroyed.

Figure 6:
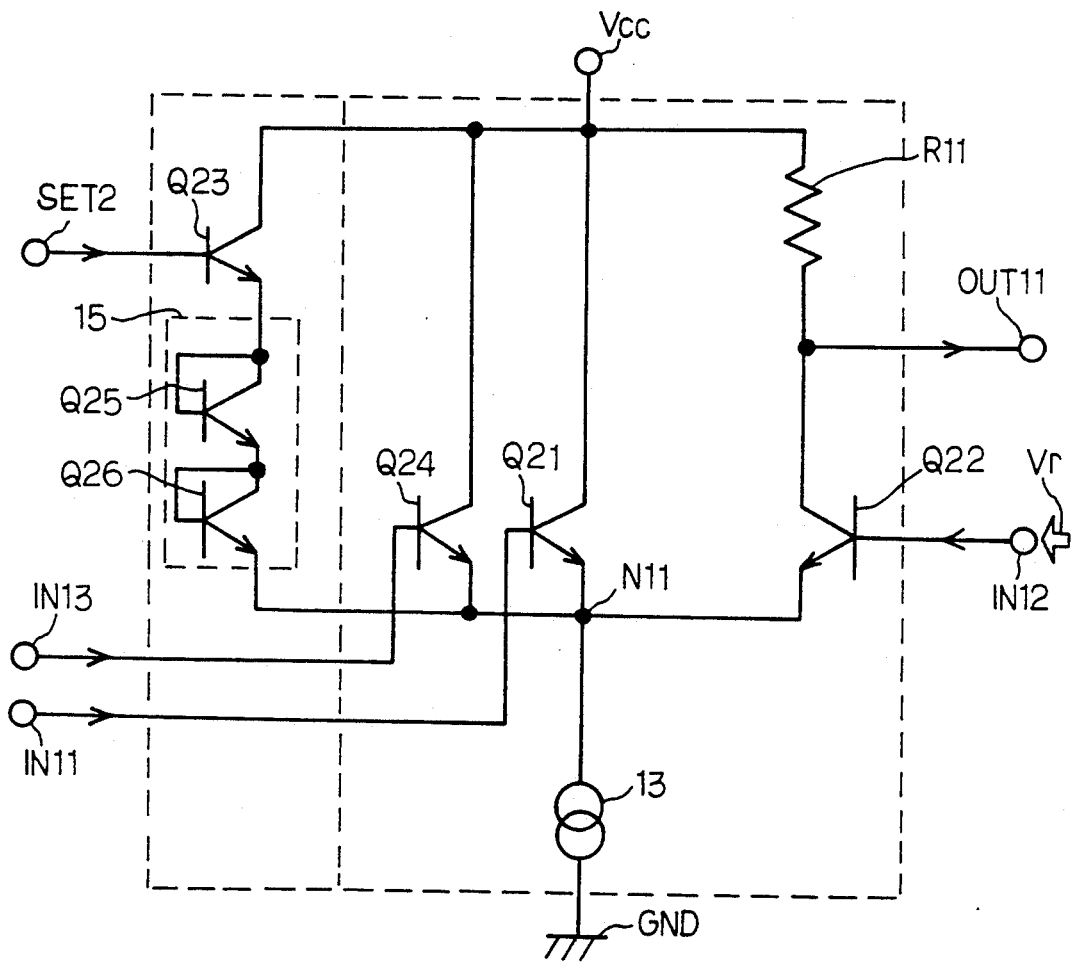
FIG. 6 is a circuit diagram showing the arrangement of a modification of the differential circuit shown in FIG. 5.

The differential circuit implementing the first embodiment can be modified as shown in FIG. 6. The modification can carries out an OR operation, and a fourth n-p-n type bipolar transistor Q24 is further coupled between the power voltage source Vcc and the common node N11. An input voltage signal in the ECL range is supplied from an input node IN13 to the base node of the fourth n-p-n type bipolar transistor Q24. However, the other circuit components are similar to those of the differential circuit shown in FIG. 5, and the corresponding circuit components are designated by the same references used in FIG. 5 without detailed description. In this modification, a level-shift circuit 15 is implemented by a series combination of diode-connected n p-n type bipolar transistors Q25 and Q26, and the common node N11 is lower in voltage level than the emitter node of the third n-p-n type bipolar transistor Q23 by about 1.4 volts.

A reference voltage Vr is supplied to the base node of the second n-p-n type bipolar transistor Q22, and the first to third n-p-n type bipolar transistors Q21, Q22 and Q24 carry out an OR operation on the input voltage signals at the input nodes IN11 and IN13. Namely, if at least one of the input voltage signals at the input node N11 or N13 becomes higher than the reference voltage level Vr at the input node N12, the associated n-p-n type bipolar transistor Q21 or Q24 increases the current passing therethrough, and the second n-p-n type bipolar transistor Q22 decreases the current passing through the resistor R11. Then, the output node OUT11 is lifted to the high voltage level. However, if both input nodes IN11 and IN13 remain low, the second n-p-n type bipolar transistor Q22 increases the current passing through the resistor R11, and the output voltage level at the output node OUT11 is lowered.

Figure 7:
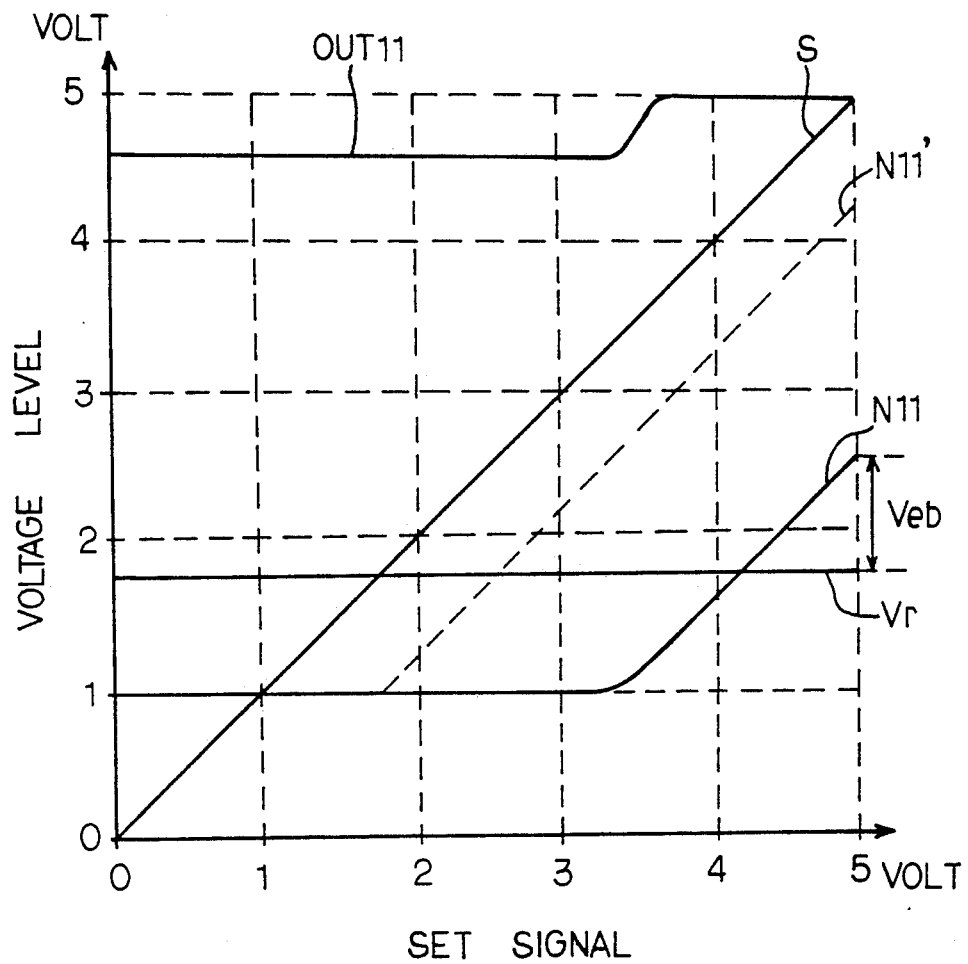
FIG. 7 is a graph showing voltage levels at essential nodes of the modification in terms of a set signal.

The advantages of the differential circuit shown in FIG. 5 are also achieved by the modification. FIG. 7 shows the voltage level at the common node N11 in terms of the voltage level of the set signal SET2. The input nodes IN11 and IN12 are fixed to the ground voltage level or other low constant voltage level, and the set signal is increased in voltage level from zero volt to five volts or Vcc level. Plots S stands for the set signal. The common node N11 is increased in voltage level together with the set signal as shown in plots N11, and reverse bias voltage Veb is applied between the base node and the emitter node of the second n-p-n type bipolar transistor Q22. The reverse bias voltage Veb is equal to or less than 1 volt. If the diodeconnected n-p-n type bipolar transistors Q25 and Q26 are deleted from the setting stage, the common node N11 is increased as indicated by plots N11', and the second n-p-n type bipolar transistor Q22 is much liable to be destroyed. Thus, the level-shift circuit 15 or the diode-connected n-p-n type bipolar transistors Q25 and Q26 can rescue the second n-p-n type bipolar transistor Q22 from destruction. The modification carries out a logical operation, no logic gate is necessary. An electric circuit fabricated from the modification is scaled down.

Second Embodiment

Figure 8:
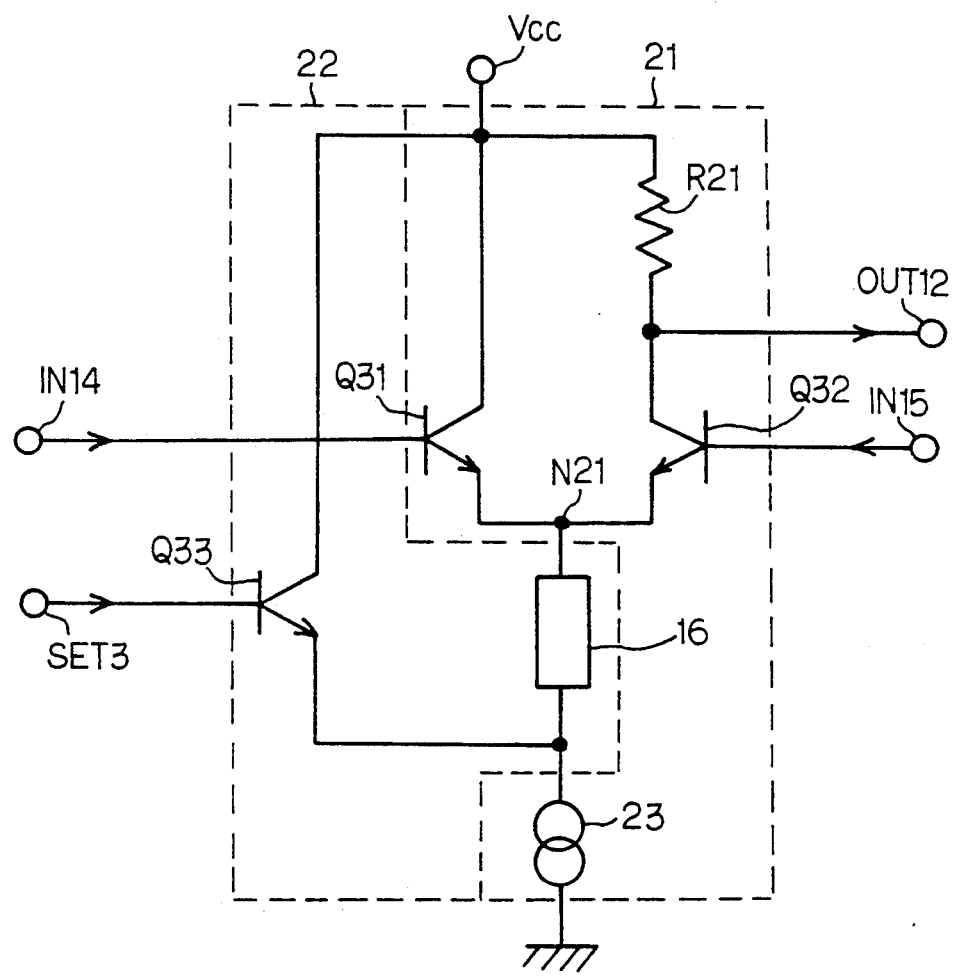
FIG. 8 is a circuit diagram showing the arrangement of another differential circuit according to the present invention.

Turning to FIG. 8 of the drawings, another differential circuit embodying the present invention largely comprises a differential stage 21 and a setting stage 22. The differential stage 21 comprises a first n-p-n type bipolar transistor Q31 coupled between a power voltage source Vcc and a common node N21, a first series combination of a resistor R21 and a second n-p-n type bipolar transistor Q32 and a constant current source 23 associated with the first n-p-n type bipolar transistor Q31 and the first series combination and coupled with a ground node GND, and a pair of input nodes N14 and N15 are respectively coupled with the base nodes of the first and second n-p-n type bipolar transistors Q31 and Q32. Input voltage signals swung in the ECL range are supplied from the pair of input nodes N14 and N15 to the first and second n-p-n type bipolar transistors Q31 and Q32. An output node OUT12 is provided between the resistor R21 and the second n-p-n type bipolar transistor Q32.

The setting stage 12 comprises a third n-p-n type bipolar transistor Q33 coupled between the power voltage source Vcc and the constant current source 23, and a level-shift circuit 16 coupled between the common node N21 and the constant current source 23, and a set signal in the CMOS range is supplied from a set node SET3 to the base node of the third n-p-n type bipolar transistor Q33.

The differential circuit thus arranged behaves as follows. While the set signal remains in zero volt, the third n-p-n type bipolar transistor Q33 is turned off, and the differential stage 21 is responsive to the input voltage signals at the pair of input nodes N14 and N15. If the input voltage signal at the input node N14 is higher than the input voltage signal at the other input node N15, the first n-p-n type bipolar transistor Q31 increases current passing therethrough, and, accordingly, the second n-p-n type bipolar transistor Q32 decreases current passing therethrough. The current thus decreased allows the resistor R21 to reduce the voltage drop, and the output voltage signal at the output node OUT12 is lifted.

On the other hand, if the input voltage signal at the input node N14 is lower than the input voltage signal at the other input node N15, the differential stage 21 lowers the output voltage signal at the output node OUT12. Thus, the differential operation is achieved by the differential stage 21 in so far as the set signal remains in zero volt.

Since the level-shift circuit 16 is inserted between the common node N21 and the emitter node of the third n-p-n type bipolar transistor Q33, only small reverse bias voltage is applied between the base node and the emitter node of the third n-p-n type bipolar transistor Q33, and the third n-p-n type bipolar transistor Q33 is hardly destroyed.

If the set signal SET3 goes up to the high voltage level, the third n-p-n type bipolar transistor Q33 turns on, and only a negligible amount of current flows through the series combination of the resistor R21 and the second n-p-n type bipolar transistor Q32. The output node OUT12 is forcibly lifted up regardless of the input voltage signal at the input node N14. Thus, the differential circuit embodying the present can also set the output node OUT12 to the high voltage level.

As described hereinbefore, the reverse bias voltage is relatively small, and it is unnecessary to lower the input voltage signals at the pair of input nodes N14 and N15. Therefore, positive voltage level supplied from the third n-p-n type bipolar transistor Q33 merely produces small reverse bias voltage between the base node and the emitter node of the n-p-n type bipolar transistor Q31 or Q32 supplied with lower input voltage signal, and the n-p-n bipolar transistors Q31 and Q32 are hardly destroyed.

Figure 9:
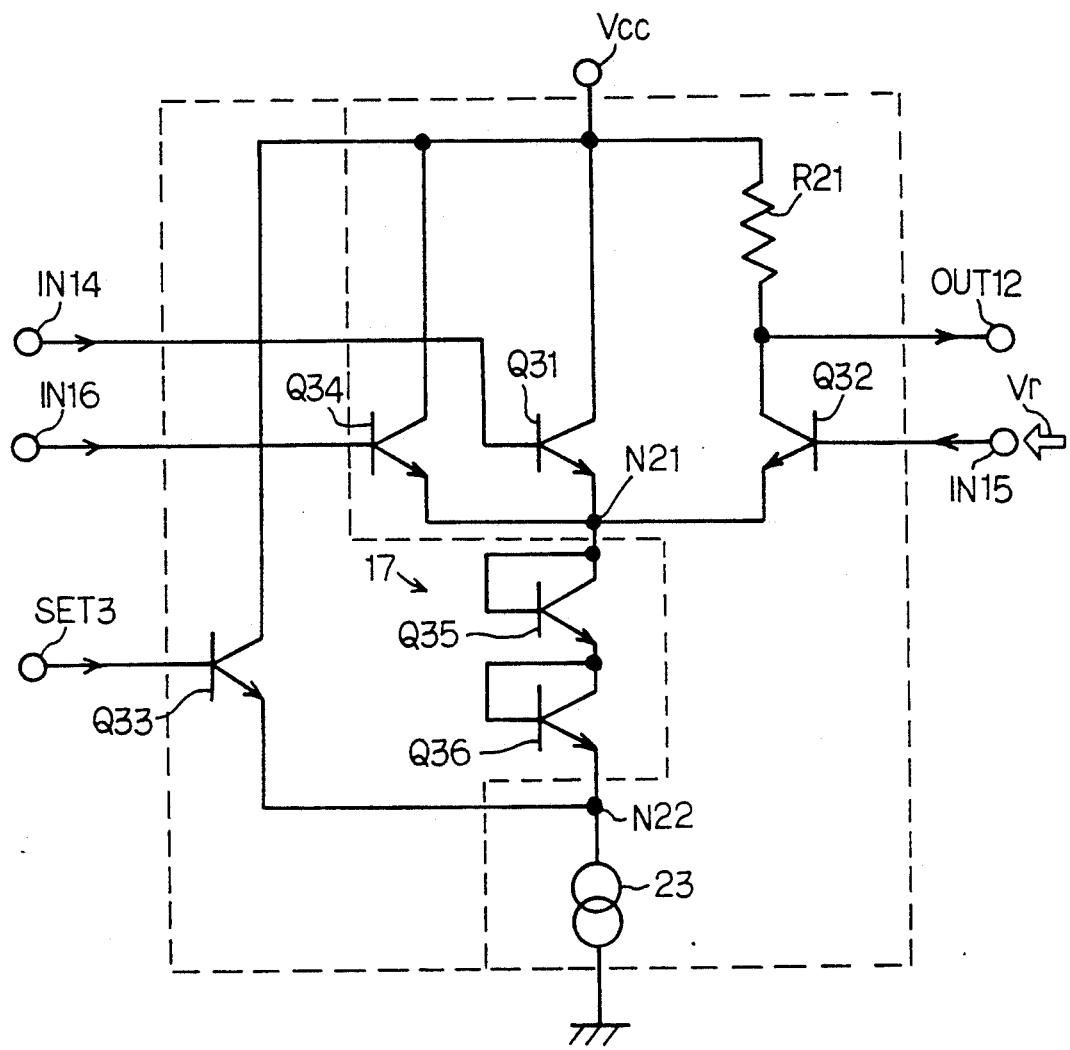
FIG. 9 is a circuit diagram showing the arrangement of a modification of the differential circuit shown in FIG. 8.

The differential circuit implementing the second embodiment can be modified as shown in FIG. 9. The modification can carries out an OR operation, and a fourth n-p-n type bipolar transistor Q34 is further coupled between the power voltage source Vcc and the common node N21. An input voltage signal in the ECL range is supplied from an input node IN16 to the base node of the fourth n-p-n type bipolar transistor Q34. However, the other circuit components are similar to those of the differential circuit shown in FIG. 8, and the corresponding circuit components are designated by the same references used in FIG. 8 without detailed description. In this modification, a level-shift circuit 17 is implemented by a series combination of diode-connected n-p-n type bipolar transistors Q35 and Q36.

A reference voltage Vr is supplied to the base node of the second n-p-n type bipolar transistor Q32, and the first to third n-p-n type bipolar transistors Q31, Q32 and Q34 carry out an OR operation on the input voltage signals at the input nodes IN14 and IN16. Namely, if at least one of the input voltage signals at the input node N14 or N16 becomes higher than the reference voltage level Vr at the input node N15, the associated n-p-n type bipolar transistor Q31 or Q34 increases the current passing therethrough, and the second n-p-n type bipolar transistor Q32 decreases the current passing through the resistor R21. Then, the output node OUT12 is lifted o the high voltage level. However, if both input nodes IN14 and IN16 remain low, the second n-p-n type bipolar transistor Q32 increases the current passing through the resistor R21, and the output voltage level at the output node OUT12 is lowered.

Figure 10:
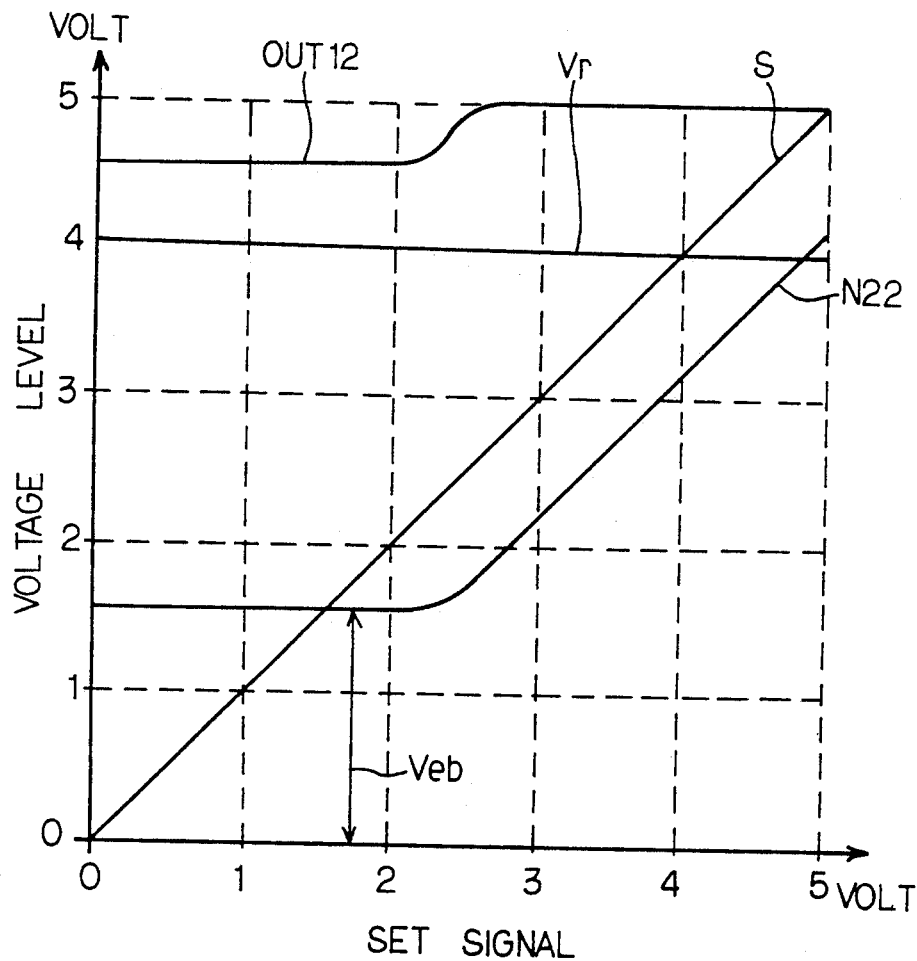
FIG. 10 is a graph showing voltage levels at essential nodes of the modification in terms of a set signal.

The advantages of the differential circuit shown in FIG. 8 are also achieved by the modification. FIG. 10 shows the voltage level at a node N22 in terms of the voltage level of the set signal SET3. The input nodes IN14 and IN16 are fixed to the ground voltage level or other low constant voltage level, and the set signal is increased in voltage level from zero volt to five volts or Vcc level. Plots S stands for the set signal. The node N22 is initially constant, and is, then, increased in voltage level together with the set signal as shown in plots N22, and reverse bias voltage Veb of about 1.6 volts is applied between the base node and the emitter node of the fourth n-p-n type bipolar transistor Q33. Therefore, the fourth n-p-n type bipolar transistor Q33 is not destroyed. Thus, the level-shift circuit 17 or the diode-connected n-p-n type bipolar transistors Q35 and Q36 can rescue the fourth n-p-n type bipolar transistor Q23 from destruction.

Although particular embodiments of the present invention have been shown and described, it will be obvious to those skilled in the art that various changes and modifications may be made without departing from the spirit and scope of the present invention. For example, the differential circuit and the modification may be fabricated from p-n-p type bipolar transistors.

What is claimed is:

1. A differential circuit comprising:
   a) first and second input nodes where first and second input voltage levels swung in an ECL range are applied;
   b) a differential stage having a first bipolar transistor coupled between a first source of voltage level and a common node, a first series combination of a resistor and a second bipolar transistor coupled between said first source of voltage level and said common node, and a constant current source coupled between said common node and a second source of voltage level different from said first source of voltage level, said first and second input voltage levels being supplied to base nodes of said first and second bipolar transistors, respectively;
   c) an output node provided between said resistor and said second bipolar transistor; and
   d) a setting stage having a second series combination of a third bipolar transistor and a level-shift means coupled between said first source of voltage level and said common node, said third bipolar transistor being responsive to a set signal swung in a CMOS range for forcibly setting said output node to a predetermined level.

2. A differential circuit as set forth in claim 1, in which said differential stage further has a fourth bipolar transistor coupled between said first source of voltage level and said common node, a third input voltage level in said ECL range being supplied from a third input node to the base node of said fourth bipolar transistor so that said differential stage achieves a logical operation on said one of said first and second input voltage signals and said third input voltage signal.

3. A differential circuit as set forth in claim 2, in which said level-shift means is implemented by a series combination of diode-connected bipolar transistors.

4. A differential circuit comprising:
   a) first and second input nodes where first and second input voltage levels swung in an ECL range are applied;
   b) a differential stage having a first bipolar transistor coupled between a first source of voltage level and a common node, a first series combination of a resistor and a second bipolar transistor coupled between said first source of voltage level and said common node, and a constant current source associated with said first bipolar transistor and said first series combinations and coupled with a second source of voltage level different from said first source of voltage level, said first and second input voltage levels being supplied to base nodes of said first and second bipolar transistors, respectively;
   c) an output node provided between said resistor and said second bipolar transistor; and
   d) a setting stage having a third bipolar transistor coupled between said first source of voltage level and said constant current source and a level-shift means coupled between said common node and said constant current source, said third bipolar transistor being responsive to a set signal swung in a CMOS range for forcibly setting said output node to a predetermined level.

5. A differential circuit as set forth in claim 4, in which said differential stage further has a fourth bipolar transistor coupled between said first source of voltage level and said common node, a third input voltage level in said ECL range being supplied from a third input node to the base node of said fourth bipolar transistor so that said differential stage achieves a logical operation on said one of said first and second input voltage signals and said third input voltage signal.

6. A differential circuit as set forth in claim 5, in which said level-shift means is implemented by a series combination of diode-connected bipolar transistors.

* * * * *